(12) United States Patent
Cho et al.

(10) Patent No.: US 6,603,656 B2
(45) Date of Patent: Aug. 5, 2003

(54) STAND APPARATUS IN A WIRELESS LAN ADAPTER

(75) Inventors: Sung Eun Cho, Suwon (KR); Gi Lyong Na, Suwon (KR); Bong Rak Choi, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/990,288

(22) Filed: Nov. 23, 2001

(65) Prior Publication Data
US 2003/0021084 A1 Jan. 30, 2003

(30) Foreign Application Priority Data
Jul. 27, 2001 (KR) .................................... 2001-0045565

(51) Int. Cl.[7] ................................................ G06F 1/16
(52) U.S. Cl. ...................... 361/683; 361/724; 248/917; 16/346
(58) Field of Search ................................ 361/680–683, 361/686, 724–727; 248/917–923, 398; 16/340; 375/200, 202; 439/354

(56) References Cited
U.S. PATENT DOCUMENTS

| | | | | |
|---|---|---|---|---|
| 5,108,062 A | * | 4/1992 | Detwiler | ................... 248/185 |
| 5,822,361 A | | 10/1998 | Nakamura et al. | ........... 375/202 |
| 5,854,735 A | * | 12/1998 | Cheng | ......................... 361/681 |
| 5,859,762 A | * | 1/1999 | Clark et al. | ................. 361/686 |
| 2003/0021084 A1 | * | 1/2003 | Cho et al. | .................... 361/683 |

* cited by examiner

Primary Examiner—Darren Schuberg
Assistant Examiner—Hung Van Duong
(74) Attorney, Agent, or Firm—Lowe Hauptman Gilman & Berner, LLP

(57) ABSTRACT

A stand device in a wireless LAN adapter is provided. The stand device includes a receptacle defined by a base plate and side extensions, a support unit formed on the base plate, a stand, and a holding unit coupled to the stand and supported bu the support unit. The stand is rotatably connected to the holding unit. A plurality of protrusions formed on the holding unit are engaged with respective grooves formed on support unit in order to maintain the rotation angle of the holding unit and the stand with respect to the support unit and the adapter. An elastic member elastically coupling the holding unit to the support unit is disposed between the holding unit and the support unit. The elastic member does not rotate about the adapter and the support unit while the stand and the holding unit rotates about the elastic member, support unit, and the adapter.

24 Claims, 6 Drawing Sheets

STAND APPARATUS IN A WIRELESS LAN ADAPTER

BACKGROUND OF THE INVENTION

1. Field of the Invention

The present invention relates to a stand apparatus in a wireless LAN adapter, and more particularly, to a stand apparatus having a stand protruding from and retracted into the wireless LAN adapter.

2. Description of The Related Art

Generally, a local area network(LAN) enables a plurality of individual and independent computers to communicate with each other within a limited area. The LAN allows the computers to share information data with each other using communication channels.

If a wire LAN is used in the individual or portable computer, a PCMCIA card is needed to be inserted into the computer, and then application or drive software is installed in the computer in order to connect the computer to the LAN.

If a wireless LAN is used in the individual or portable computer, a wireless LAN adapter 10 is disposed adjacent to the computer, such as a notebook PC, as shown in FIG. 1, and then the computer is connected to the LAN after the software is installed in the computer.

When wireless LAN adapter 10 operates, wireless LAN adapter 10 should be placed upright on a table or ground in order to increase the amount and the transmission rate of processed data during a unit period of time in the computer. However, an additional and individual separate stand is needed to support wireless LAN adapter 10 upright because of the thin structure of wireless LAN adapter 10 in length and width. Therefore, it is very disadvantageous for a user when the volume of both wireless LAN adapter 10 and the additional stand increases, and when wireless LAN adapter 10 is frequently fallen down and then broken down.

SUMMARY OF THE INVENTION

It is an object according to the present invention to provide an improved wireless LAN adapter able to be placed upright on a table or ground adjacent to a computer.

It is another object to provide an improved wireless LAN adapter able to be mounted with a stand without increasing the adapter in both size and volume.

It is still an object to provide an improved wireless LAN adapter having a stand protruding from the adapter in order to support the adapter upright and being retracted into the adapter without being projected from the adapter.

It is yet an object to provide an improved wireless LAN adapter having a stand rotatably mounted in the adapter.

It is still yet another object to provide an improved wireless LAN adapter having a receptacle accommodating a stand rotatably coupled to the adapter.

It is also an object to provide an improved wireless LAN adapter able to prevent the adapter from being fallen down from an upright position.

It is further object to provide an improved wireless LAN adapter able to remove any additional and individual separate stand apparatus from the adapter.

These and other objects may be achieved by providing an improved wireless LAN adapter having a main body having side extensions disposed in a lower portion of the main body and a base plate coupled between the side extensions, a receptacle defined by the base plate and the side extensions, a stand rotatably disposed within the receptacle, a support unit formed on the base plate, and a holding unit coupled to the stand and supported by the support unit. The stand is fixedly connected to the holding unit while the holding unit is rotatably coupled to the support unit and the main body.

A plurality of protrusions formed on the holding unit are engaged with respective grooves formed on support unit in order to maintain a rotation angle of the holding unit and the stand with respect to the support unit of the main body.

An elastic member elastically coupling the holding unit to the main body is disposed between the holding unit and the main body. The elastic member does not rotate about the adapter and the support unit while the stand and the holding unit rotates about the elastic member, support unit, and the adapter.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
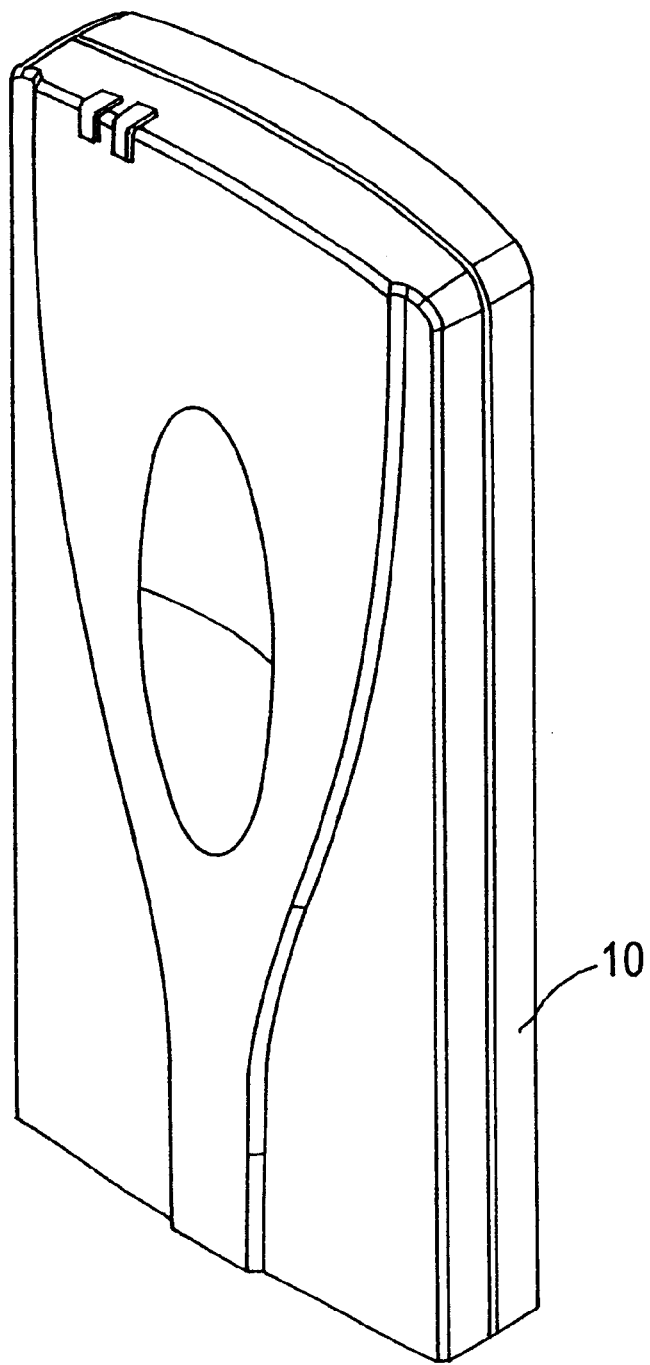
FIG. 1 is a perspective view of a wireless LAN adapter.
Figure 2:
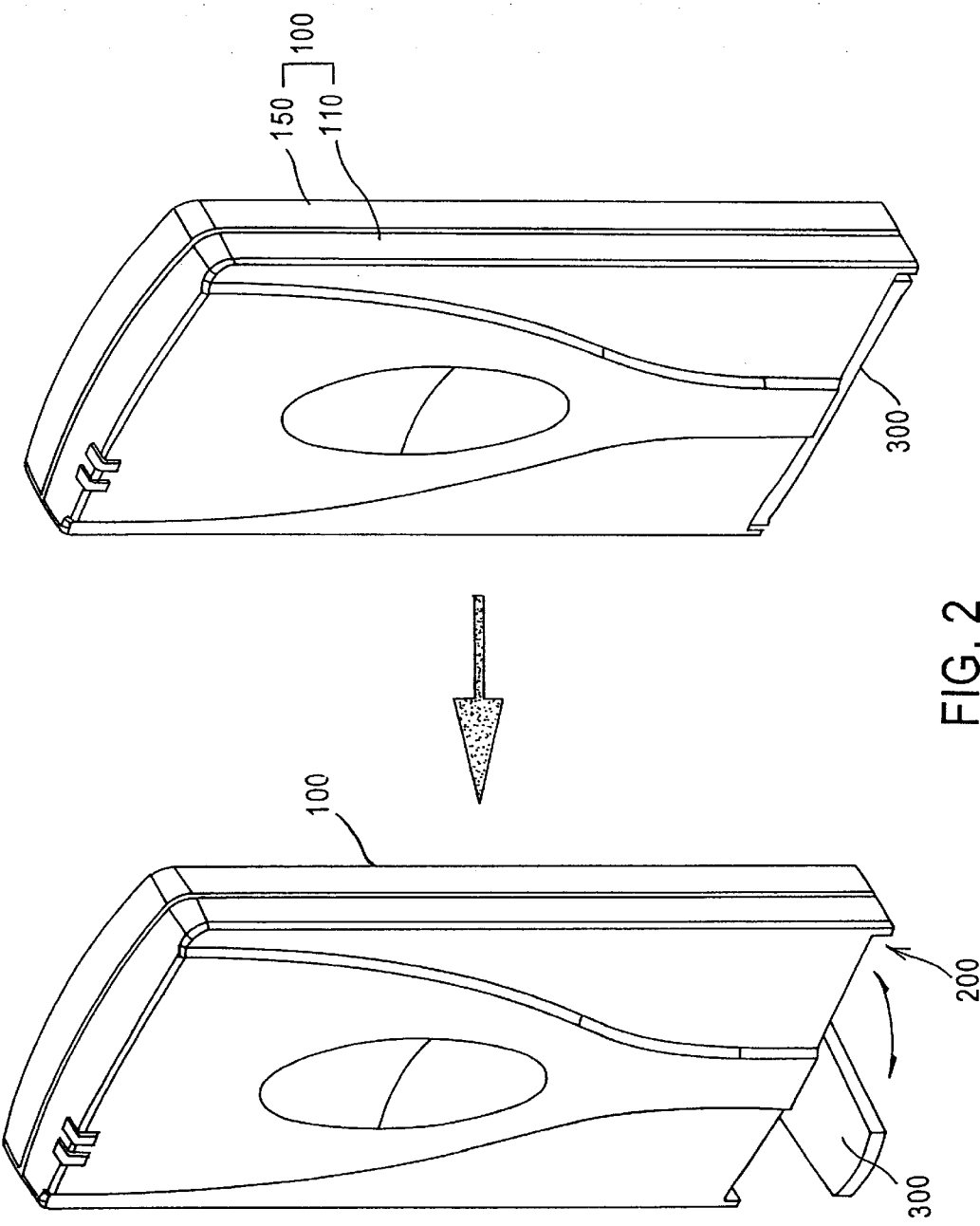
FIG. 2 is a perspective views showing a stand protruding from and being retracted into the wireless LAN adapter.
Figure 3:
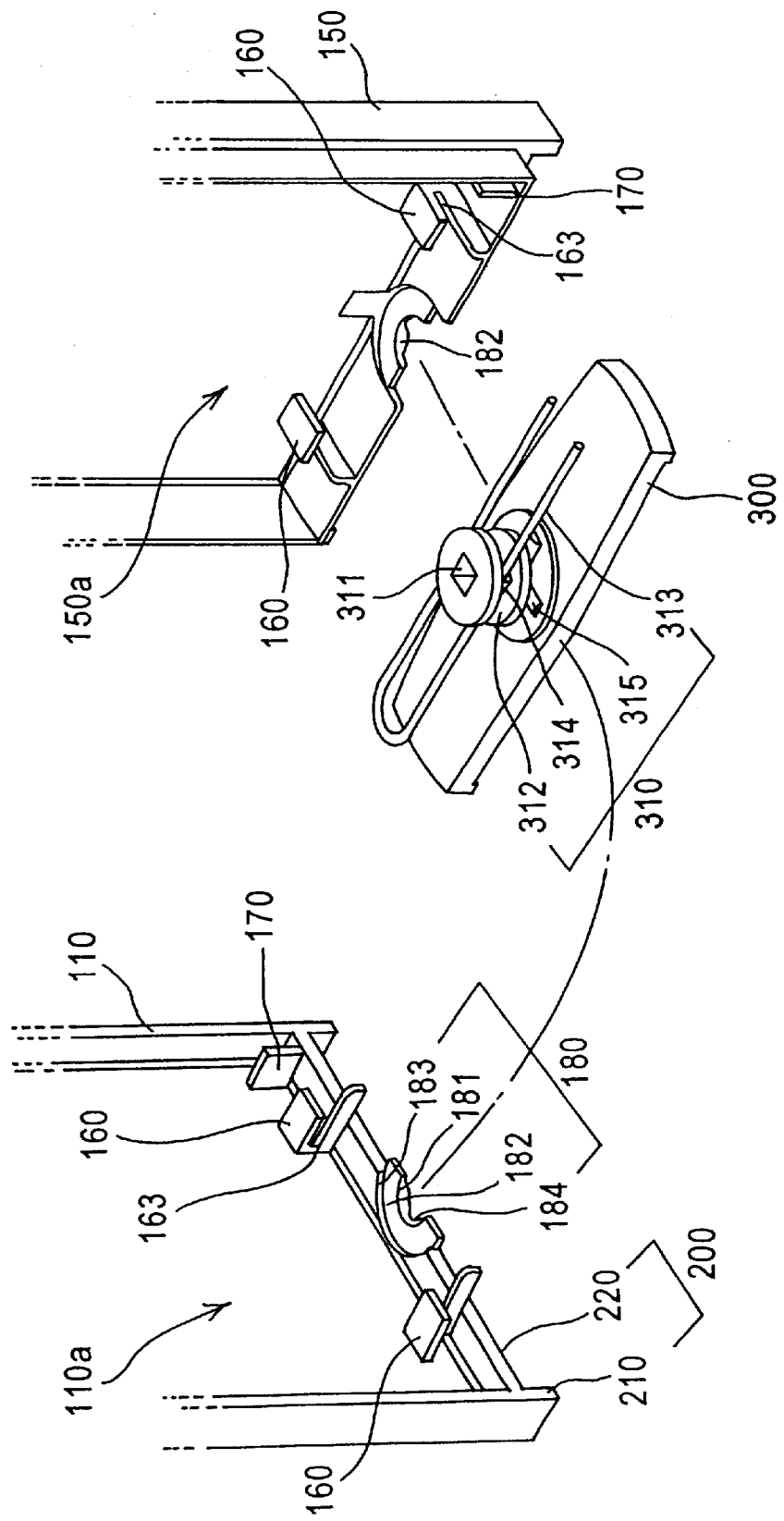
FIG. 3 is an exploded view of the wireless LAN adapter.

Turning now to the drawings, a wireless LAN adapter includes a main body 10, a receptacle 200 formed on a lower portion of main body 100, and a stand 300 disposed within receptacle 200. Stand 300 protrudes from and is retracted into receptacle 200 as shown in FIGS. 2 through 6.

Main body 100 includes a first cover 110 and a second cover 150 coupled to first cover 110. A supporting unit 180 is formed on a lower portion of first and second covers 110, 150 and supports a holding unit 310 coupled to stand 300. Holding unit 310 rotates about support unit 180. Two side extensions 210 are formed on both first and second covers 110, 150. A base plate 220 is formed between two side extensions 210. Receptacle 220 is defined by both two side extensions 210 and base plate 220.

An elastic member 313 includes two legs joined by a connection portion having a U shape. Two legs of elastic member 313 have respective free ends. Both a stopper 160 and a holder 170 formed on each of first and second covers 110, 150 couple the legs, the free ends, and the connecting portion of elastic member 313 to support unit 180 of first and second covers 110, 150. Elastic member 313 is fixed to support unit 180 while the two legs of elastic member 313 are maintained to be parallel to each other and are elastically held by support unit 180 because the free ends and the connecting portion are caught between holders 170, and because the legs of elastic member 313 is caught by each guide 163 formed on stopper 160.

Support unit 180 formed on each base plate 220 of first and second covers 110, 150 includes a half circular plate 180 formed on a central portion of base plate 220. An upper surface of base plate 220 is elevated from half circular plate 180 by a height of an elevation 183. When first cover 110 is coupled to second cover 150 to form main body 100, respective half circular plates 180 of first and second covers 110, 150 form a complete circular plate. A semi-circular hole 181 is formed in each of half circular plate 182. Respective semi circular holes 181 of half circular plate 182 of first and second covers 110, 150 form a complete circular hole when first cover 110 is coupled to second cover 150 to form main body 100. A plurality of grooves 184 are formed on a bottom surface of half circular plate 182 in a radial direction.

A pair of stoppers 160 are disposed on base plate 200 and both sides of support unit 180. Each of stoppers 160 has a slot accommodating corresponding one of the legs of elastic member 313. One of the legs of elastic member 313 is coupled to on a first pair of stoppers 160 of first cover 110 while the other one of the legs of elastic member 313 is coupled to a second pair of stoppers 160 of second cover 150 when first cover 110 is coupled to second cover 150 to form main body 100 of the adapter. Each leg of elastic member 313 is held between respective pair of stoppers 160 of first and second cover 110, 150. A guide hole 163 is formed on each slot of stopper 160. Each leg of elastic member 313 is inserted into guide holes 163 of respective first and second covers 110, 150. Stopper 160 includes an upper plate and a lower plate facing the upper plate. The slot is formed between the upper plate and the lower plate to receive the insertion of a portion of the leg of elastic member 313. When first and second covers 110, 150 are assembled into main body 100 of the adapter, each leg of elastic member 313 is elastically fixed to stoppers 160. A holder 170 formed on base plate 220 prevents the free ends or the connecting portion of elastic member 313 from moving and rotating.

Stand 300 disposed within receptacle 200 and below base plate 220 is fixedly coupled to holding unit 310. Stand 300 rotates by holding unit 310 rotating about support unit 180.

Holding unit 310 includes a shaft 311 fixedly coupled to an upper side of stand 300, two holding plates 312 coupled to shaft 311 and spaced-apart from each other by a thickness of the legs of elastic member 313, and a polygon structure 314 formed between two holding plates 312 and around shaft 311. Polygon structure 314 is disposed between legs of elastic member 313 while the free ends of elastic member are biased against each other by stopper 160. Opposite sides of polygon structure 314 are contact with respective legs of elastic member. Polygon structure 314 is one of a rectangular, an octagon, etc.

A plurality of protrusions 315 are formed on the upper side of stand 300 and around shaft 314 in a radial direction. Protrusions 315 faces a lower one of two holding plates 312. The lower one of holding plates 312 is spaced-apart stand 300 by a thickness of the complete circular plate formed by two half circular plates 182 of supporting unit 180. Protrusions 315 are positioned in respective grooves 184 of supporting unit 180. When stand 300 and holding unit 310 rotate with respect to support unit 180 and first and second covers 110, 150, each protrusion 315 is shifted from the corresponding groove 184 to an adjacent grooves 184 and then inserted into adjacent groove 184.

Each of half circular plate 182 of supporting unit 180 is inserted around shaft 311 and between stand 300 and the lower one of holding plates 312 when first and second covers 110, 150 are assembled into main body 200.

When first cover 110 and second covers 150 are assembled into main body 100 of the wireless LAN adapter, a wireless LAN unit not shown is disposed between first cover 110 and second cover 150 and within an internal space formed by first and second covers 110, 150.

Stand 300 is disposed within receptacle 200 formed on the lower portion of first and second covers 110, 150 and defined by main plate 220 and side extensions 210 of first and second covers 110, 150. Two half circular plates 182 of first and second cover 110, 150 are inserted between stand 300 and the lower one of holding plates 312. Shaft 311 is rotatably disposed within the complete circular hole formed by two opposite semi circular holes 181 of each of half circular plates 182.

Stand 300, shaft 311, and holding plate 312 are rotatable with respect to support unit 180. When stand 300 is pulled out from receptacle 200 to maintain the adapter upright on the table, stand 300 rotates with a predetermined angle from main body 200 in accordance with the engagement between grooves 184 of support unit 180 and protrusions 315 of holding unit 310.

It is very convenient for a user to carry the adapter when stand 300 is disposed within receptacle 200. If stand 300 rotates to be pulled out from receptacle 200, stand 300 having an angle with main body 100 of the adapter prevents the adapter from falling down from an upright position of the adapter. Therefore, capacity of the wireless LAN adapter increases because the adapter is maintained to be perpendicular to a horizontal plane of the ground.

The assembling process of the wireless adapter is described as follows. After elastic member 313 is inserted between two holding plates 312 and mounted on opposite sides of polygon structure 314 of holding unit 310, stand 300 is inserted into receptacle 300.

When stand 30 is coupled to main body 100, half circular plates 182 formed on base plate 220 of first and second covers 110, 150 are inserted between stand 300 and the lower one of holding plates 312 and around shaft 311 between stand and the lower one of holding plates 312. Shaft 311 rotates within a hole formed by two semi circular holes 181 of half circular plate 182 of first and second covers 110, 150.

At the same time, both legs of elastic member 313 are inserted into each guide hole 163 of each slot formed on stoppers 160 while both legs contact respective opposite sides of polygon structure 314 formed around shaft 311 between two holding plates 312. The free ends and the connecting portion of elastic member 313 are caught by holder 170 formed on first and second covers 110, 150. First cover 110 is fixedly coupled to second cover 150 by a coupling element, such as a screw or hooks and protrusions formed on first and second covers 110, 150, respectively.

A lower portion of stopper 160 of first cover 110 forming the slot and guide hole 163 with an upper portion of stopper 160 protrudes from base plate 220 toward second cover 150. Both ends of half circular plate 182 formed on first cover 110 protrude from a longitudinal side of base plate 220 of first cover 110 toward second cover 150 while both ends of half circular plate 182 formed on second cover 150 is retracted from a longitudinal side of base plate 220 of second cover 150 from a side surface of base plate 220 of second cover 150 mating with base plate 220 of first cover 110.

When first cover 110 is coupled to second cover 150, the lower portion of stopper 160 of first cover 110 is disposed on base plate 220 of second cover 150 and adjacent corresponding lower portion of stopper 160 of second cover 150 while two ends of half circular plate 182 of first cover 110 inserted into base plate 220 of second cover 150 in order to mate with both ends of half circular plate 182 of second cover 150 in order to form a complete circular plate.

Because elastic member 313 is inserted into guide hole 163 formed on the slot of stopper 1600, elastic member 313 is prevented from rotation and movement with respect to first and second covers 110, 150. Although elastic member 313 is made of a U shaped-elastic material, any shaped elastic member may be used for elastic member 313 as long as the elastic member 313 contacts one or both sides of polygon structure 314 in order to elastically couple shaft 313 of holding unit 310 to supporting unit 180 of first or second cover 110, 150.

When stand 300 is inserted into receptacle 200, protrusions 315 are inserted into respective grooves 184 of supporting unit 180. The angle between stand 300 and main body 100 is controlled in accordance with the angle between grooves 182 or between protrusions 315.

Stand 300 rotates about main body 100 by being pulled out from receptacle 200 and by shifting protrusions 315 from corresponding grooves 184 to adjacent grooves 184. Therefore, stand 300 forms 90 degree with main body 100 in order to support main body 100 upright and prevent main body from being falling down. The lowest portion of side extensions 210 of first and second covers 110, 150 has the same plane as a bottom side of stand 300. The bottom of stand 300 and the lowest portion of side extensions 210 of first and second covers 110, 150 are leveled. Even if stand 300 forms 90 degrees with main body 100, the bottom side of stand 300 is disposed on the same plane as the lowest portion of side extensions 210 of first and second covers 110, 150. Therefore, main body 100 is maintained to be upright and prevented from being fallen down.

The angle between stand 300 and main body 100 may be controlled by both grooves 184 and protrusions 315 or by both polygon structure 314 and elastic member 313 being contact with one or opposite sides of polygon structure 314 formed around shaft 311 disposed between two holding plate 311.

A rotation angle of stand 300 with respect to main body 100 is controlled by elastic member 313 and polygon structure 314 as follows. Both legs of elastic member 313 fixedly held by stopper 160 formed on each of first and second covers 110, 150 is elastically spaced-apart from each other by an external force. Stand 300 rotates by being pulled out from receptacle 200 or by moving protrusions 315 from corresponding one of grooves 184 to adjacent ane of grooves 184. The legs of elastic member 313 becomes biased against each other when each of the legs of elastic member 313 contacts a portion disposed between two adjacent sides of polygon structure 314. If the external force is removed, elastic member 313 is forced to contact opposite sides of polygon structure 314 by elastic force of elastic member 313. Therefore, elastic member 313 prevents stand 300 from rotating, and then stand 300 stops being rotated.

Figure 4:
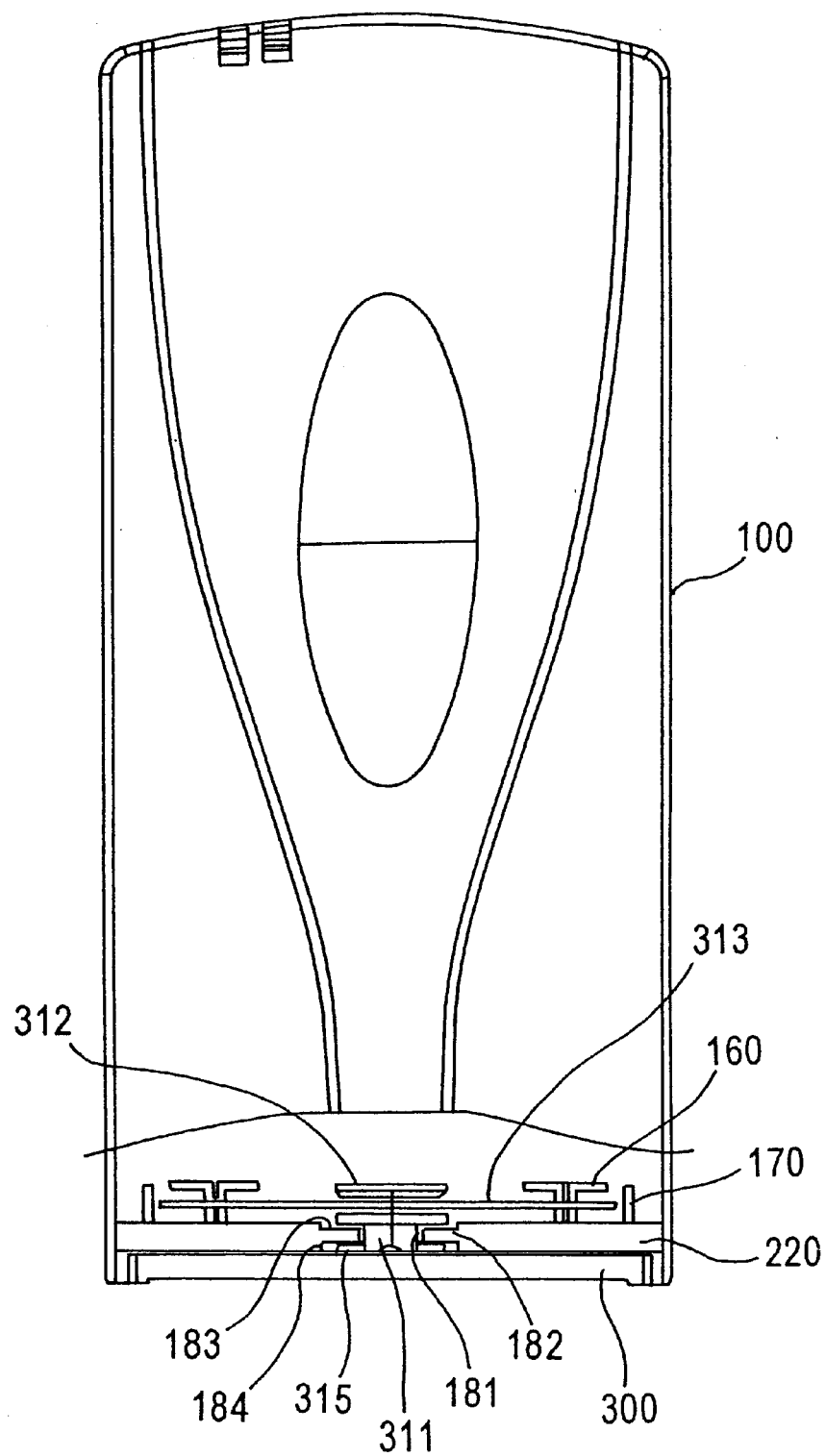
FIG. 4 is a partial cross-sectional view showing a stand, a holding unit, and a support unit in the wireless LAN adapter.

As shown in FIG. 4, two holding plates 312 are mounted around shaft 311, and elastic member 313 is disposed around shaft 311 and between two holding plates 312. Elastic member 313 is prevented from moving by stopper 160 and holder 170. Half circular plate 182 formed on base plate 220 is inserted between stand 300 and the lower one of two holding plates 312. The upper surface of base plate 220 is elevated from half circular plate 182 by the height of elevation 183. Protrusions 315 are inserted into corresponding grooves 184. The external force may be needed to shift each protrusion 315 from corresponding groove 184 into adjacent groove 184. During shifting from the corresponding groove to the adjacent groove, protrusion 315 contacts a bottom surface of half circular plate 182.

Figure 5A:
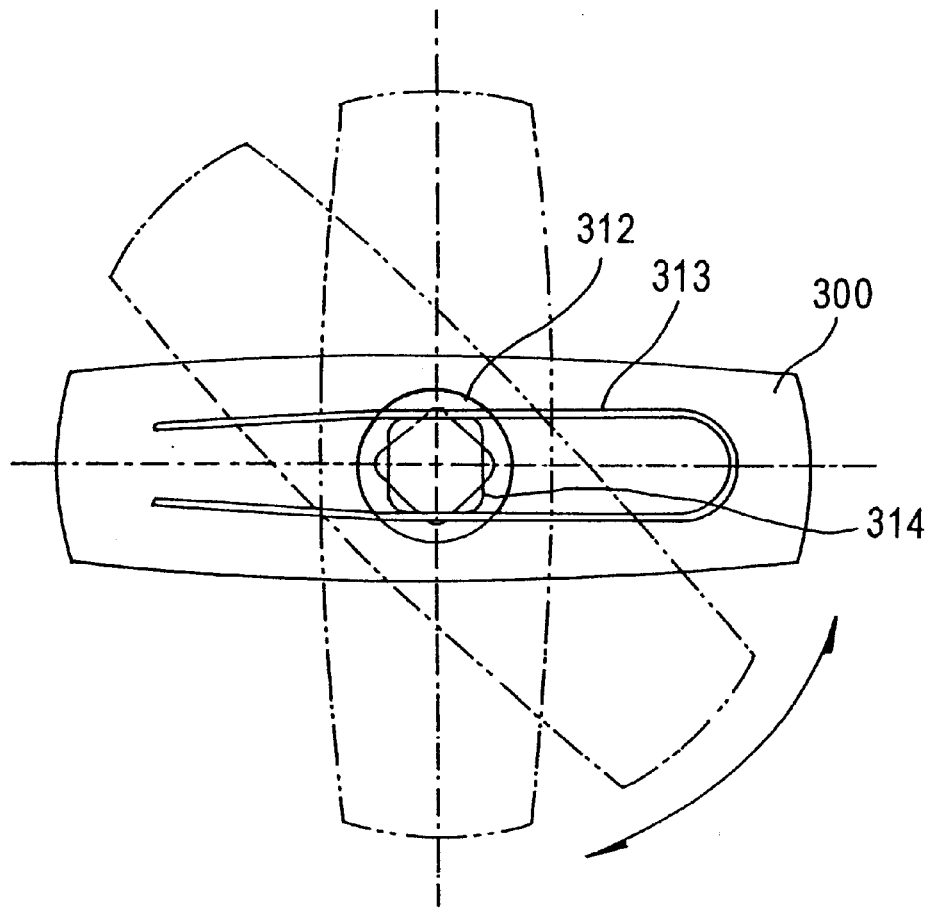
FIGS. 5A and 5B show plain and front views showing the stand, the holding unit, and the support unit of the wireless LAN adapter.
Figure 5B:
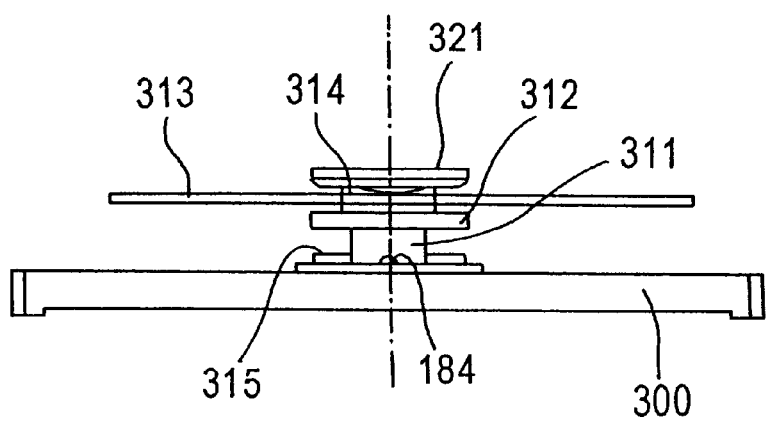

FIG. 5A shows the angle formed between stand 300 and main body 100. In FIG. 5B, reference numerals 3210, 3120 denote two holding plates 312. Opposite sides of polygon structure 314 contact the respective legs of elastic member 313. When stand 300 rotates, the legs of elastic member 313 are shifted form corresponding opposite sides to adjacent opposite sides of polygon structure 314.

Figure 6:
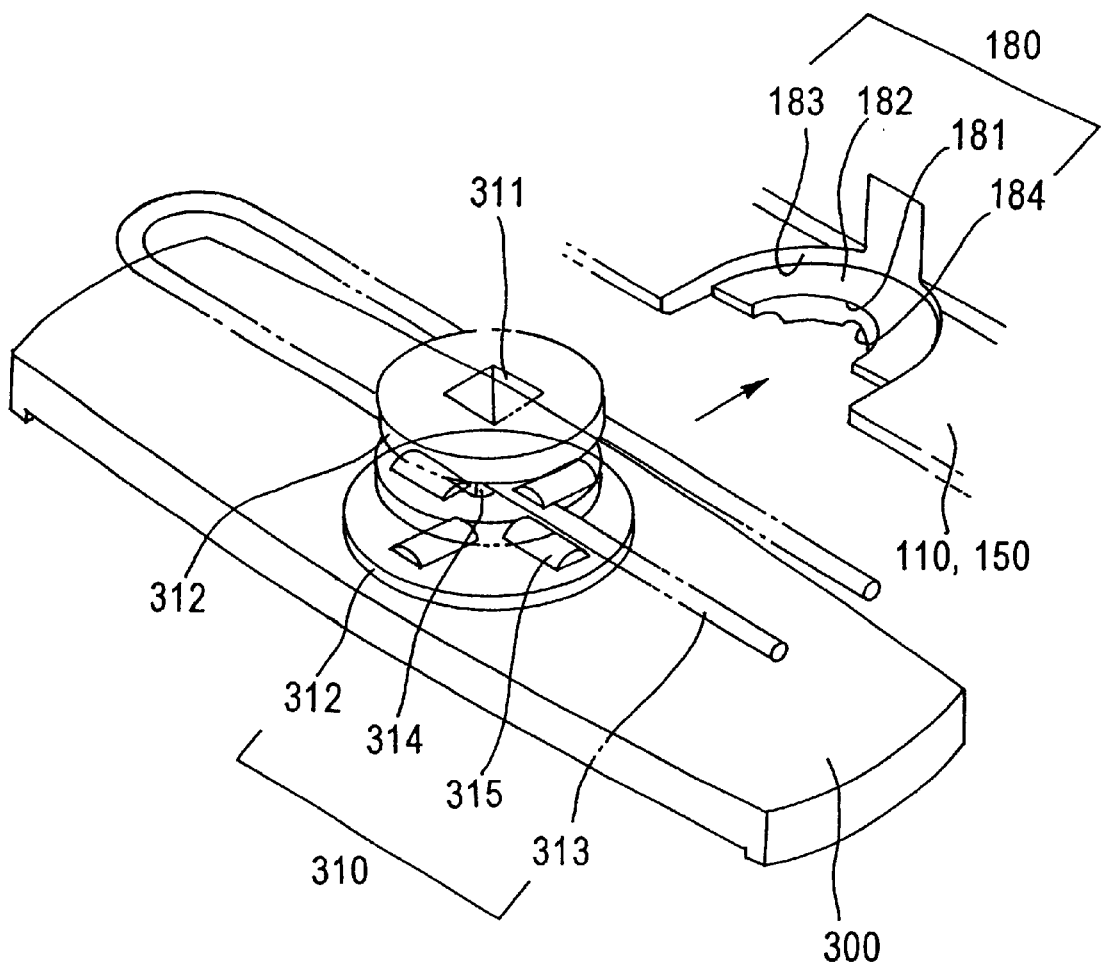
FIG. 6 is a perspective view showing details of the support unit, the holding unit, and the stand of the adapter.

Detailed structures of holding unit 310 and supporting unit 180 are shown in FIG. 6. By coupling holding unit 310 into supporting unit 180 of first and second covers 110, 150, stand 300 is coupled to main body 100 without using any other additional coupling element, such as a screw.

As described above, the stand apparatus constructed according to the principles of the present invention enabled the wireless LAN adapter to be maintained in an upright position without increasing the volume of the adapter. Any additional external stand is no longer needed.

What is claimed is:

1. An stand apparatus in an adapter:
   a main body having a first cover and a second covers attached to said first cover, said main body having both an inside space and an outside space defined by said first and second covers;
   a stand rotatably disposed in said outside space of said main body;
   a shaft mounted on said stand, disposed in said inside space of said main body;
   two holding plates coupled to said shaft and spaced-apart from each other, disposed within said inside space of said main body;
   a supporting unit formed on a portion in said inside space of said main body to support said shaft, said two holding plates, and said stand; and
   an elastic member disposed between said two holding plates, elastically coupling said shaft to said main body.

2. The apparatus of claim 1, with said inside space comprising a first internal receptacle and a second internal receptacle formed inside of said first cover and said second cover, respectively, to accommodate a wireless LAN unit.

3. The apparatus of claim 1, said outside space formed in a lower portion of said main body.

4. The apparatus of claim 1, with said supporting unit comprising a half circular plate formed on a base plate disposed on a lower portion of each of said first and second covers, an elevation formed between an upper surface of said base plate and said half circular plate, and a semi circular hole formed on said half circular plate, said supporting unit formed on each of said first and second covers, said half circular plate of said first cover mating with said half circular plate of said second cover.

5. The apparatus of claim 1, with said half circular plate comprising a plurality of grooves formed on a bottom of said half circular plate in a radial direction of said shaft.

6. The apparatus of claim 5, with said stand including a plurality of protrusions formed around said shaft on an upper surface of said stand, said protrusions corresponding to respective grooves of said half circular plate of said first and second covers.

7. The apparatus of claim 1, further comprising:
   a polygon structure formed around said shaft between said two holding plates; and said elastic member coupled to said one of said first and second covers and disposed between said two holding plates to contact a side of said polygon structure in order to couple said shaft to said first and second covers.

8. The apparatus of claim 7 with said elastic member being a spring elastically contacting said side of said polygon structure of said shaft.

9. The apparatus of claim 1, further comprising:

a stopper formed on each of said first and second covers to fix each side of said elastic member to said first and second cover, respectively; and a holder formed on each of said first and second covers to fix each end of said elastic member.

10. The apparatus of claim 1, with said outside of said main body defined by extensions of a lower portion of said main body and a base plate coupled between extensions.

11. The apparatus of claim 1, with said stand comprising a bottom side having the same plane as a bottom of said first and second cover.

12. The apparatus of claim 1, with said shaft having a polygon structure lengthwise in shape.

13. The apparatus of claim 1, with said shaft having one of a rectangular and an octagon lengthwise in shape.

14. A stand apparatus in an adapter comprising:

a main body having a supporting unit disposed within an inside of said main body, a stopper disposed within said inside said main body, and a receptacle formed on an outside of said main body;

a stand disposed within said receptacle to protrude from and be retracted into said receptacle;

a holding unit formed on said stand, rotatably coupled to said supporting unit of said main body; and an elastic member disposed within said main body, elastically coupling said holding unit to said stopper of said main body.

15. The apparatus of claim 14, with said supporting unit formed on a base plate disposed on a lower portion of said main body.

16. The apparatus of claim 15, with said supporting unit comprising a hole formed on said base plate, said holding unit rotatably inserted into said hole of said supporting unit.

17. The apparatus of claim 15, with said holding unit disposed within said inside of said main body.

18. The apparatus of claim 14, with said holding unit comprising a shaft having a first end fixed to said stand and a second end inserted into said inside of said main body through a hole formed on said supporting unit.

19. The apparatus of claim 18, with said second end of said shaft coupled to said main body through said elastic member.

20. The apparatus of claim 18, with said holding unit comprising a holding plate coupled to said second end of said shaft, said elastic member connected to said holding plate and being elastically coupled between said stopper and said shaft.

21. The apparatus of claim 18, further comprising:

a protrusion formed on an upper surface of said stand; and a groove formed on said supporting unit, contacting said protrusion.

22. The apparatus of claim 18, with said shaft is rotatably supported by said supporting unit.

23. The apparatus of claim 18, with said stand and said first end of said shaft disposed within said receptacle while said second end of said shaft is disposed within said inside of said main body.

24. The apparatus of claim 18, with said holding unit having a holding plate formed on said second end of said shaft, said holding plate disposed within said inside of said main body, said supporting unit disposed between said holding plate and said stand in order to rotatably couple said stand to said supporting unit of said main body.

\* \* \* \* \*